US009048274B2

(12) United States Patent
Wang et al.

(10) Patent No.: US 9,048,274 B2
(45) Date of Patent: Jun. 2, 2015

(54) PORTABLE STOCKER AND METHOD OF USING SAME (75) Inventors: Wei-Cheng Wang, Jongli (TW); Feng-Ning Lee, Longtan Shiang (TW); Chi-Feng Tung, Jhunan Township, Miaoli County (TW); Mao-Lin Kao, Jhunan Township (TW); Li-Jen Ko, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1114 days.

(21) Appl. No.: 12/329,664

(22) Filed: Dec. 8, 2008

(65) Prior Publication Data

US 2010/0143082 A1    Jun. 10, 2010

(51) Int. Cl.
*H01L 21/677* (2006.01)

(52) U.S. Cl.
CPC .... *H01L 21/67775* (2013.01); *H01L 21/67766* (2013.01)

(58) Field of Classification Search
CPC .............. H01L 21/6773; H01L 21/67775; B65B 31/028
USPC ................ 414/331.04, 416.03, 937
See application file for complete search history.

(56) References Cited

U.S. PATENT DOCUMENTS

| | | | | |
|---|---|---|---|---|
| 5,411,358 A | * | 5/1995 | Garric et al. | 414/277 |
| 5,443,346 A | * | 8/1995 | Murata et al. | 414/222.13 |
| 6,129,496 A | * | 10/2000 | Iwasaki et al. | 414/222.01 |
| 6,678,583 B2 | * | 1/2004 | Nasr et al. | 700/245 |
| 6,778,879 B2 | | 8/2004 | Chang et al. | |
| 7,039,499 B1 | * | 5/2006 | Nasr et al. | 700/245 |
| 7,044,703 B2 | * | 5/2006 | Fukuda et al. | 414/416.03 |
| 7,099,739 B2 | | 8/2006 | Chen et al. | |
| 7,356,378 B1 | | 4/2008 | Huang et al. | |
| 7,441,999 B2 | | 10/2008 | Nakao et al. | |
| 7,771,151 B2 | * | 8/2010 | Bonora et al. | 414/217.1 |
| 7,917,245 B2 | * | 3/2011 | Murata | 700/224 |
| 2003/0091410 A1 | * | 5/2003 | Larson et al. | 414/217 |
| 2004/0109746 A1 | * | 6/2004 | Suzuki | 414/373 |
| 2005/0125095 A1 | | 6/2005 | Chen et al. | |
| 2006/0022097 A1 | * | 2/2006 | Homer et al. | 248/146 |
| 2006/0051188 A1 | | 3/2006 | Hoshino et al. | |
| 2006/0257233 A1 | * | 11/2006 | Bonora et al. | 414/217 |

(Continued)

FOREIGN PATENT DOCUMENTS

| | | | |
|---|---|---|---|
| JP | 2007335475 A | * | 12/2007 |
| TW | I244462 | | 11/1992 |
| TW | M307598 | | 9/1995 |
| TW | 516148 | | 1/2003 |

*Primary Examiner* — Jonathan Snelting
(74) *Attorney, Agent, or Firm* — Duane Morris LLP (57) ABSTRACT

A system comprising a conveyor. A semiconductor processing tool has a lifter port. The tool is positioned near the conveyor, such that the lifter port is configured to transport a Front Opening Unified Pod (FOUP) between the conveyor and the lifter port. An upstream stocker and a downstream stocker are both co-located with the conveyor and the tool. The upstream and downstream stockers each have a respective storage space for the FOUP and a respective robotic device configured to transport the FOUP between its respective storage space and the conveyor. The upstream stocker is configured to receive the FOUP from an overhead transport (OHT) and deliver the FOUP to the conveyor. The downstream stocker is configured to receive the FOUP from the conveyor and deliver the FOUP to the OHT.

16 Claims, 7 Drawing Sheets

(56) References Cited

U.S. PATENT DOCUMENTS

| | | |
|---|---|---|
| 2007/0210533 A1* | 9/2007 | Okabe et al. .................. 277/628 |
| 2007/0248439 A1* | 10/2007 | Asari et al. .................... 414/217 |
| 2007/0264114 A1 | 11/2007 | Ma et al. |
| 2007/0286711 A1* | 12/2007 | Hashimoto et al. ........... 414/217 |
| 2008/0228310 A1 | 9/2008 | Wang et al. |
| 2009/0035102 A1 | 2/2009 | Zimmerhackl et al. |
| 2009/0067957 A1* | 3/2009 | Ando ....................... 414/222.05 |
| 2010/0204826 A1* | 8/2010 | Sawado et al. ................ 700/228 |

\* cited by examiner

PORTABLE STOCKER AND METHOD OF USING SAME

FIELD OF THE INVENTION

The present invention relates to automated materials handling systems for semiconductor fabrication facilities.

BACKGROUND

Semiconductor integrated circuit fabrication facilities ("fabs") are highly automated. Movement of semiconductor wafers between various process tools is accomplished by an automated material handling system (AMHS). The wafers are typically transported through the fab in Front Opening Unified Pods (FOUPs), wafer holding devices capable of holding up to 25 wafers of 300 mm diameter.

A FOUP is a specialized enclosure designed to hold semiconductor wafers securely and safely in a controlled environment, and to allow the wafers to be removed for processing or measurement by tools equipped with appropriate load ports and robotic handling systems. Fins in the FOUP hold the wafers in place, and a front opening door allows robot handling mechanisms to access the wafers directly from the FOUP. A FOUP can be located on a load port, and can be manipulated by the AMHS.

The AMHS transport vehicles travel relatively long distances to carry the FOUPs between tools that perform different fabrication processes. The tools may be located within different portions of the same building, or in different buildings.

Figure 1:
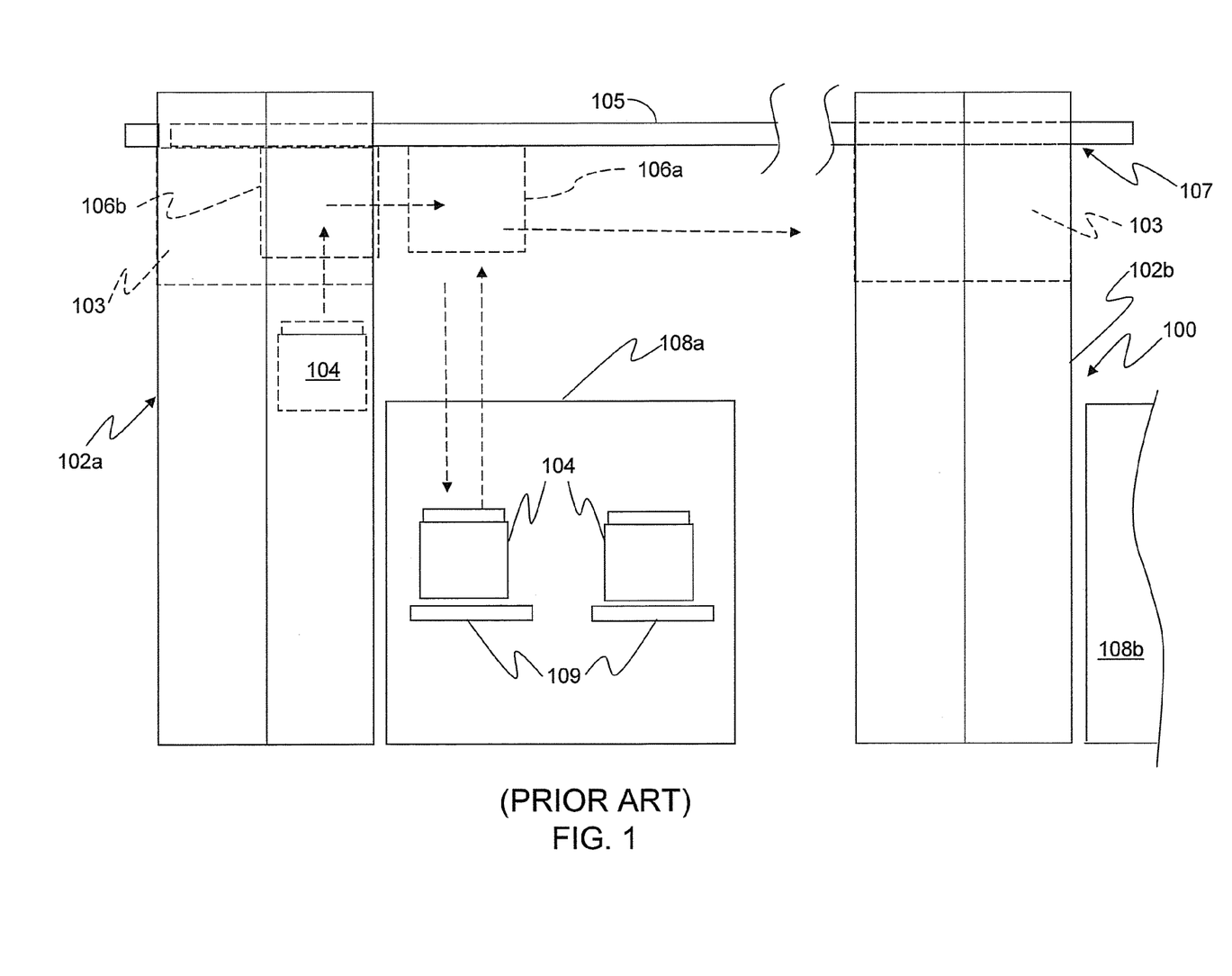
FIG. 1 is a diagram of a conventional system.

FIG. 1 is a diagram of a system 100. The system has a plurality of pieces of fabrication equipment (tools) 108a, 108b, which may be separated from each other by a relatively large distance (e.g., tens or hundreds of meters). Typically each tool 108a (108b) has an associated stocker 102a (102b) for wafer cassettes within the FOUPs 104, holding wafer lots waiting to be processed by the associated tool 108a (108b). FOUPs 104 are transferred from a load port 103 of a stocker 102a to a tool 108a via an overhead transport system (OHT) 107 having transport vehicles 106a, 106b, in a sequential order according to lot orders communicated from a real time dispatching system (not shown). Lots not queued for processing within the associated tool 108a remain in a wafer cassette within an associated FOUP 104; the associated FOUP 104 is routed to vehicle 106a of the overhead transport system 107 for transporting the FOUP 104 to the stocker 102b associated with the next tool 108b to be visited, for further processing.

FIG. 1 shows the stockers 102a, 102b installed beside the tools 108a, 108b, respectively. In a typical operating sequence, the processed lot 104 in the load port 109 of tool 108a is removed from the load port 109 and transported by an OHT vehicle 106a to the stocker 102b at the next destination tool 108b. The OHT vehicle 106a moves in one direction along its track 105. The next lot which is going to be processed is transported by another OHT vehicle 106b to the load port 109 of the tool 108a, from the stocker 102a. It takes a comparatively long time to finish swapping FOUPs, in part because two different vehicles 106a, 106b are used to remove a first FOUP 104 from the load port 109 of tool 108a and to transport a second FOUP from the stocker 102a to the load port 109. There may be a delay of about two minutes between the visit by vehicle 106a and the visit by vehicle 106b.

The long FOUP swap time results in reduced tool duty cycle and reduced tool productivity.

SUMMARY OF THE INVENTION

In some embodiments, a system comprises a conveyor. A semiconductor processing tool has a lifter port. The tool is positioned near the conveyor, such that the lifter port is configured to receive a Front Opening Unified Pod (FOUP) from the conveyor and transport the FOUP, where the FOUP is adapted for storing a wafer. At least one stocker is co-located with the conveyor and the tool. The at least one stocker has a storage space for the FOUP and a robotic device configured to transport the FOUP between the storage space and the conveyor.

In some embodiments, a system comprises a conveyor. A semiconductor processing tool has a lifter port. The tool is positioned near the conveyor, such that the lifter port is configured to transport a Front Opening Unified Pod (FOUP) between the conveyor and the lifter port. An upstream stocker and a downstream stocker are both co-located with the conveyor and the tool. The upstream and downstream stockers each have a respective storage space for the FOUP and a respective robotic device configured to transport the FOUP between its respective storage space and the conveyor. The upstream stocker is configured to receive the FOUP from an overhead transport (OHT) and deliver the FOUP to the conveyor. The downstream stocker is configured to receive the FOUP from the conveyor and deliver the FOUP to the OHT.

In some embodiments, a method comprises providing at least a first stocker having a robotic device, a conveyor; and a semiconductor processing tool having a lifter port. The first stocker, conveyor and tool are co-located with each other. A Front Opening Unified Pod (FOUP) is transported directly from an output port of the first stocker to the conveyor using the robotic device of the first stocker. The FOUP is transported on the conveyor directly to the lifter port of the tool.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Figure 2:
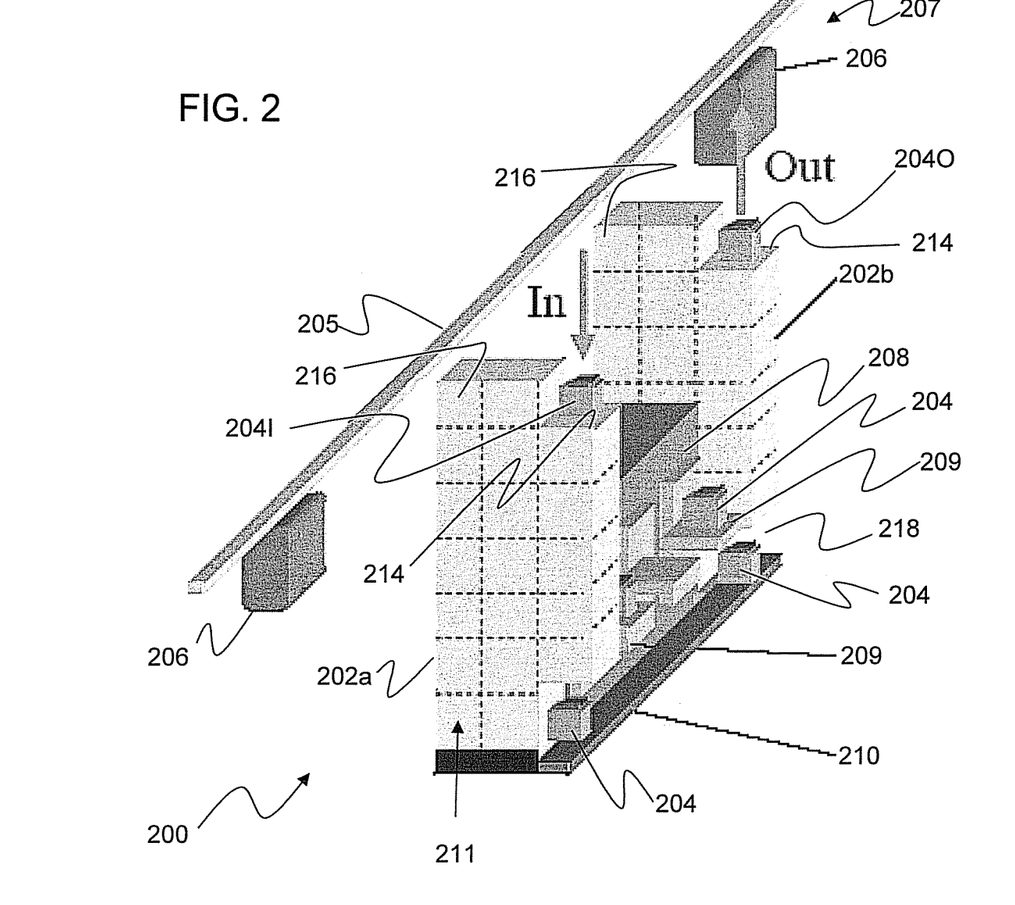
FIG. 2 is an isometric view of an embodiment of the present invention.
Figure 3:
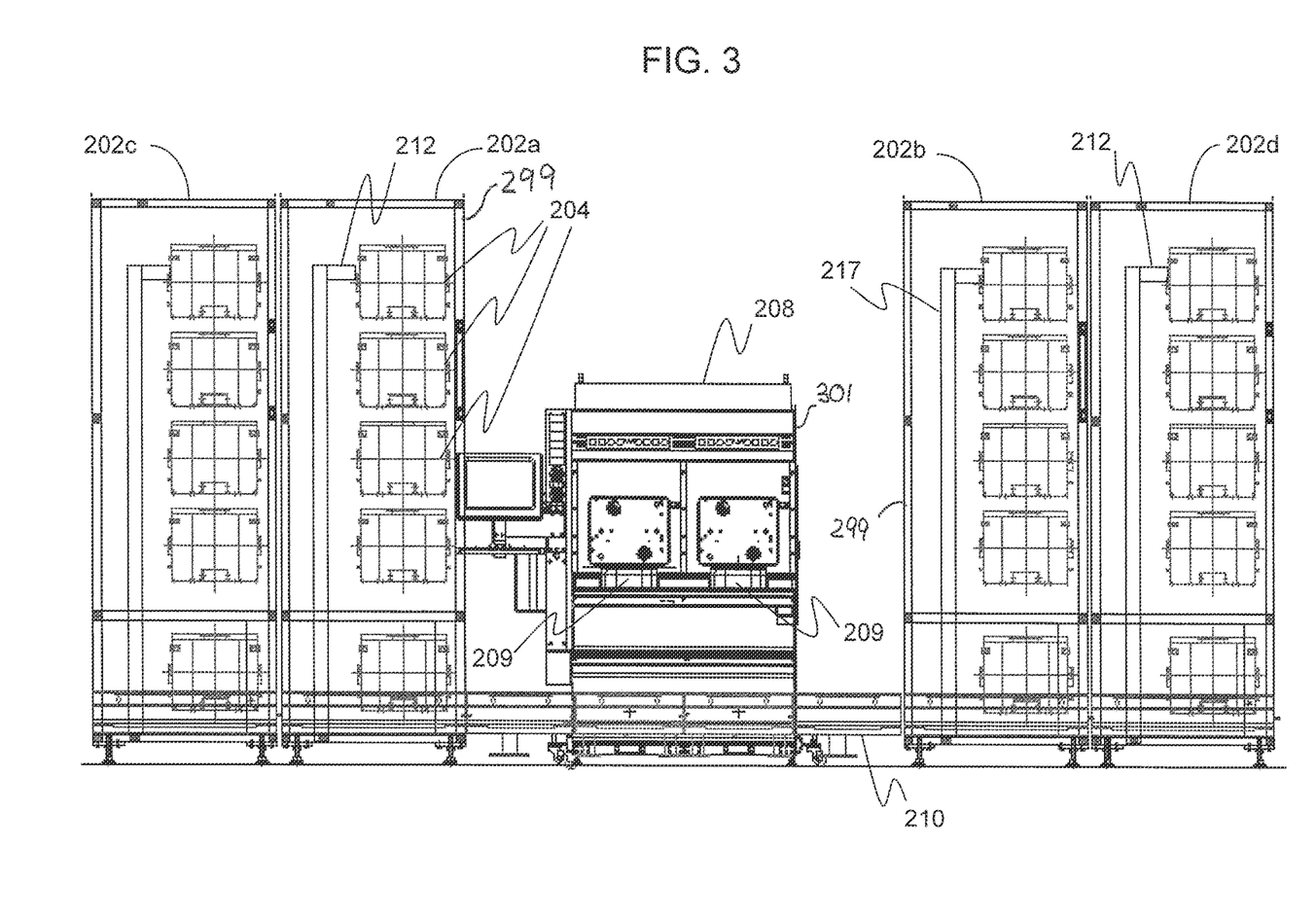
FIG. 3 is a front elevation view of the system of FIG. 2.
Figure 4A:
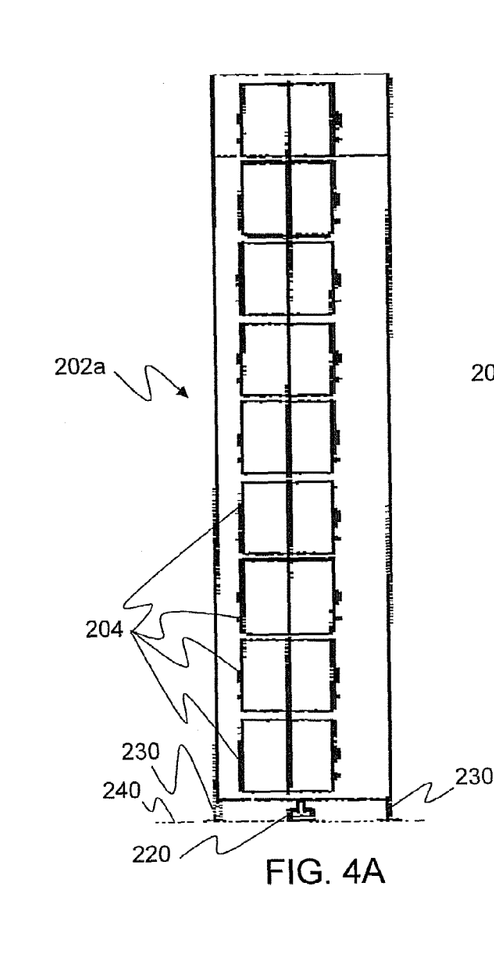
FIG. 4A is a cutaway rear elevation view of the stocker of FIG. 2.
Figure 4B:
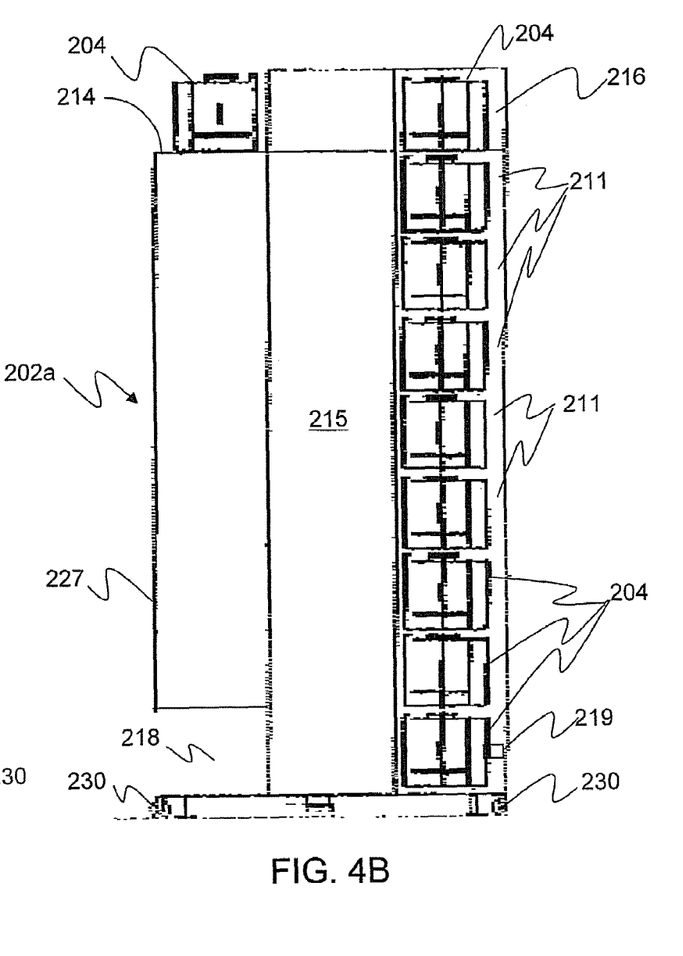
FIG. 4B is a side elevation view of the stocker of FIG. 2.

FIGS. 2-6 are diagrams of an exemplary system 200 having a tool 208 and at least one near-tool buffer 202a, 202b, which may be mini-stockers. FIG. 2 is an isometric view of the system 200. FIGS. 3-4B are partial cutaway drawings, to show the storage of FOUPs 204 inside the stocker 202a of FIG. 2, but one of ordinary skill understands that the stocker 202a has a housing with external walls, as shown in FIG. 2. The only FOUPs 104 that are actually visible are the FOUPs at the OHT port 214 and the conveyor port 218 (FIGS. 2 and 4B). As shown in FIG. 2, an exemplary system 200 includes an upstream stocker 202a, a conveyor 210, a tool 208, and a downstream stocker 202b.

Referring now to FIG. 2, the semiconductor processing tool 208 has a lifter port 209 capable of controlled vertical movement between a height of the conveyor 210 and a height of the wafer port of tool 208. The tool 208 is positioned near the conveyor 210, such that the lifter port 209 is configured to receive a FOUP 204 adapted for storing a wafer 250 (FIG. 4) from the conveyor 210 and transport the FOUP 204. The tool may use the Directly loaded Transport (DLT) technique by Asyst Technologies Inc. of Fremont, Calif. which comprises floor conveyors 210 and lifting load ports 209. The lifting port 209 includes a robotic device to retrieve a FOUP from the conveyor 210 and raise the FOUP to the tool port. The conveyor 210 runs underneath a shelf in front of the load port of tool 208, which has a lifting mechanism 209. A ledge on the load port can move up or down, retracting beneath the level of the conveyor 210. A FOUP rolls out of the mini-stocker 202a and moves quickly across to the lifting load port 209 of the tool 208.

At least one stocker 202a-202d is co-located with the conveyor 210 and the tool 208. Each of the stockers 202a-202d has a storage space for the FOUP 204 and a robotic device 212 configured to transport the FOUP between the storage space 211 and the conveyor 210. In some embodiments, the stockers 202a-202d are mini-stockers. The mini-stockers are modular in design and small enough to be portable. A system 200 having mini-stockers 202a-202d can be reconfigured wherever and whenever it is convenient, for example, to perform preventive maintenance on a stocker, or to realize small lot operation. Additional mini-stockers 202c, 202d may be added to or removed from the system 200 as desired. A conveyor of different length is substituted when stockers 202c, 202d are added to or removed from system 200.

The system 200 integrates the near-tool buffer (mini-stockers) 202a-202d with the DLT 209 to reduce the swap time of FOUPs (The swap time may refer to the time period between delivery of a first FOUP from the OHT vehicle 206 to the stocker 202a and delivery of a second FOUP from the stocker 202a to the same OHT vehicle 206 or the next available OHT vehicle. The swap time may also refer to the time period between removal of a FOUP from the tool 208 by the lifting port 209 and delivery of the next FOUP from the lifting port 209 to the tool 208.)

The system 200 can store the lots in the near-tool buffers 202a, 202b and transport the lots from the buffer 202a to the load port 209 of the tool 208 or from the tool's load port to the buffers 202b on the conveyor 210, without using the OHT vehicle 206.

Although the system 200 is shown with four stockers, 202a-202d, other embodiments, have a single upstream stocker 202a and a single downstream stocker 202b. The upstream stocker 202a is configured to receive a FOUP 204 from an overhead transport system (OHT) vehicle 206 and deliver the FOUP to the conveyor 210. The downstream stocker 202b is configured to receive the FOUP 204 from the conveyor 210 and deliver the FOUP to the OHT vehicle 206. Further embodiments may have any desired number of stockers 202a-202d.

The upstream and downstream stockers 202a, 202b, respectively each have at least one storage space 211 with a shelf for storing the FOUPs 204 and a respective robotic device 212 configured to transport the FOUPs 204 between the storage spaces 211 and the conveyor 210.

Figure 6:
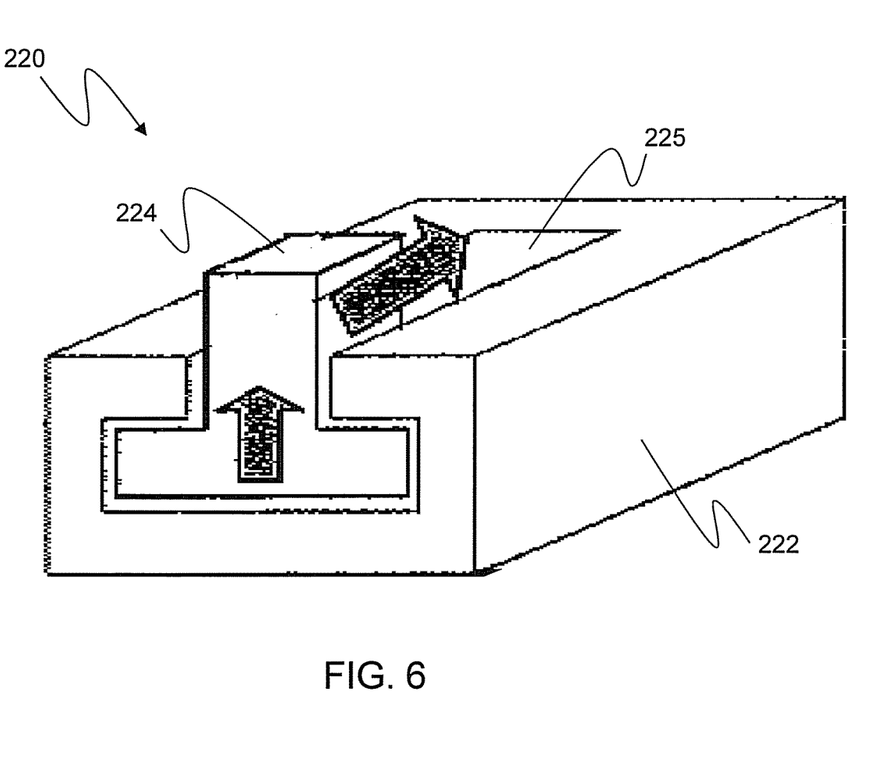
FIG. 6 is an enlarged view of the alignment mechanism of FIG. 4A.

In some embodiments, the stocker 202a, 202b is mounted on wheels 230 for moving the stocker. In some embodiments, the stocker 202a, 202b is portable and has an alignment mechanism 220 for positioning the stocker relative to the conveyor 210 and an overhead transport 207. In some embodiments, the alignment mechanism 220 includes at least one alignment member 224 mounted at a bottom of the stocker 202a, 202b. In some embodiments, the alignment mechanism 220 further includes at least one fixed member 222 adapted to engage the at least one alignment member 224. The at least one fixed member 222 is mounted to a surface (e.g., floor 240 or raised floor) on which the stocker 202a is to be located, such that positioning the stocker 202a with the at least one alignment member 224 engaging the at least one fixed member 222 positions the stocker 202a with the robotic device 212 thereof positioned to transport the FOUP 204 between the storage space 211 and the conveyor 210 and between the storage space 211 and the overhead transport 207. In one embodiment, the at least one alignment member 224 is a T-shaped rail, and the at least one fixed member 222 has a T-shaped opening 225.

Other alignment mechanisms may be used. For example the alignment member may have a variety of cross-sectional shapes, and any number of alignment members (with corresponding fixed members) may be included. Also, although FIG. 6 shows a male member on the stocker 202a and a female fixed member, in other embodiments, the stocker has a female member, and the fixed member is a male member. In other embodiments, the stocker has a male alignment member and a female alignment member, and corresponding female and male members are provided on the fixed surface.

Figure 5:
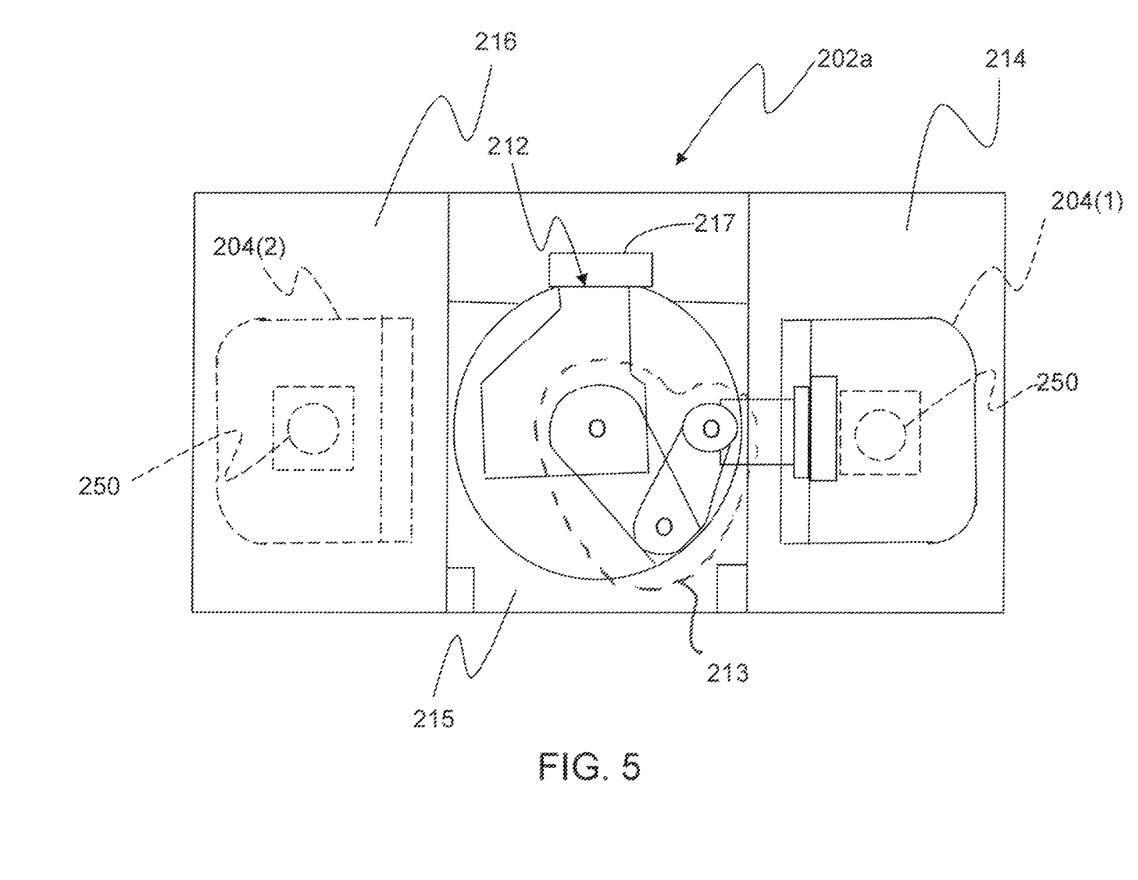
FIG. 5 is a top plan view of the stocker of FIG. 2.

In some embodiments, as shown in FIGS. 2, 3, 4A and 4B, the stocker 202a has a single vertical column containing a plurality of storage spaces 211 for storing a plurality of FOUPs 204, and the robotic device 212 is capable of vertical movement among the plurality of storage spaces. FIG. 3. shows external walls 299 of stockers 202a and 202b, and external walls 301 of tool 208. A space is present between the facing external walls 299 and 301. Each stocker 202a, 202b is thus spaced apart from tool 208. As best seen in FIGS. 2, 4B and 5, a first port (the stocker OHT port) 214 of stockers 202a, 202b is usable as an input port for receiving a first FOUP 204(1) from an overhead transport system (OHT) vehicle 206, or as an output port for delivering a second FOUP 204(2) to the vehicle 206.

In embodiments having a single vertical column the mini-stocker 202a can have a minimum size and weight given a desired height that permits the mini-stocker to exchange FOUPs with the OHT 207 and the conveyor 210, enhancing portability. Also, a lightweight robotic device 212 that only has translation in the vertical direction may be used with a mini-stocker having a single column design (A three pin mechanism 213 extends and retracts without a horizontal translation of the entire robotic device head 212). The single column design also provides flexibility to maximize the use of any available space near the tool 208, by adding as few or as many stockers 202a as the available space permits.

Additional stocker space may be added by adding another modular mini-stocker to any given system 200. The additional stockers 202c, 202d may be operatively coupled to the existing stockers 202a, 202b and the tool 208 by substituting a longer conveyor 210 capable of reaching the conveyor ports 218 of all of the stockers 202a-202d. Alternatively, if the existing conveyor 210 is of a modular, extendible type, then one or more sections may be added to the conveyor 210 to increase its length sufficiently to service stockers 202c and 202d.

Reference is made to FIG. 5, which is a top plan view of stocker 202a. In some embodiments, a first FOUP 204(1) is received from, and a second FOUP 204(2) is delivered to, the same OHT vehicle 206 during a single visit of the vehicle 206 to the stocker OHT port 214. A second port (temporary output port) 216 is usable as a storage buffer for temporarily storing the second FOUP 204(2) while the first FOUP 204(1) is received from vehicle 206 of OHT 207 and moved to one of the storage spaces 211. The temporary output port 216 (FIGS. 4B, 5) is used for temporarily holding the second FOUP 204(2). Once the robotic device 212 has moved the incoming FOUP 204(1) to one of the storage spaces 211, the second FOUP 204(2) is ready at the temporary output port 216 for rapid retrieval by robotic device 212, transfer to the OHT port 214 by the robotic device 212, and delivery by the robotic device 212 to the OHT 207 during a single visit by the vehicle 206 to the stocker 202a.

The robotic device 212 is capable of moving the first FOUP 204(1) from the stocker OHT port 214 to a first one of the plurality of storage spaces 211, and is capable of moving the second FOUP 204(2) from a second one of the plurality of storage spaces 211 to the temporary output port 216.

In some embodiments, the conveyor 210 is reversible, the stocker 202b is also able to receive a FOUP 204 from the OHT vehicle 206 and deliver the FOUP 204 to the conveyor 210, and the upstream stocker 202a is also able to receive the FOUP 204 from the conveyor 210 and deliver the FOUP 204 to the OHT vehicle 206. Essentially, either stocker 202a, 202b can serve as an "upstream" stocker to provide a FOUP 204 to the tool 208, and either stocker 202a, 202b can serve as a "downstream" stocker to receive a FOUP 204 from the tool 208. In the case where the OHT vehicle 206 only moves in one direction, the ability to transfer a FOUP from the nominal downstream stocker 202b to the tool 208 via the conveyor 210 avoids a long delay that would otherwise occur if a FOUP 204 from downstream stocker 202b is transported to the tool 208 via vehicle 206, and has to follow the entire length of the OHT track 205 to reach the tool 208 from stocker 202b.

Referring again to FIGS. 2 and 5, the robotic device 212 is configured to transport the FOUP 204 directly from a storage space 211 of the stocker 202a to the conveyor 210 via conveyor port 218, or directly from the conveyor 210 to the storage space 211 (i.e., without using the OHT vehicle 206 to move the FOUP 204 between the stocker 202a and the lifter port 209). The robotic device 212 is also configured to transport the FOUP 204 directly from an OHT port 214 of the stocker 202a to the storage space 211, or from the OHT port 214 to the conveyor 210 (without placing the FOUP 204 in a storage space 211).

The robotic device 212 travels vertically within the central column 215 of the stocker 202a. In some embodiments, the robotic device 212 includes a rotating head mechanism 213 having three kinetic pins. Rotation of the three-pin mechanism 213 by 90 degrees causes the mechanism 213 to extend or retract, causing linear translation of the FOUP 204 into or out from one of the storage spaces 211, the OHT port 214, or the temporary storage port 216. In some embodiments, the robotic devices 212 are provided by Daifuku Co. Ltd of Osaka, Japan, or Muratec (Murata Machinery, USA, Inc.). of Charlotte, N.C. In other embodiments, different robotic devices may be used, optionally having the same or additional degrees of freedom in motion.

After the FOUP 204 is moved from one of the storage spaces 211 or ports 214, 216 into the central column 215 of the stocker 202a, the rotating head 213 of the robotic device 212 moves vertically along its track 217 to deliver the FOUP 204 to one of the storage spaces 211 or to the conveyor 210. As best seen in FIG. 2, the rotating head 213 of the robotic device 212 is configured to deliver the FOUP to the conveyor 210 via conveyor port 218, the same way a FOUP is delivered to the OHT port 214. The head 213 rotates, causing extension of the three-pin mechanism to move the FOUP 204 out from the central column 215 to the conveyor port 218 of the stocker 202a, from which it is loaded onto the conveyor 210.

In some embodiments, the stocker 202a includes an optional port 219 (FIG. 4B) for charging the FOUP 204 with an atmosphere of nitrogen or clean dry air.

Figure 7:
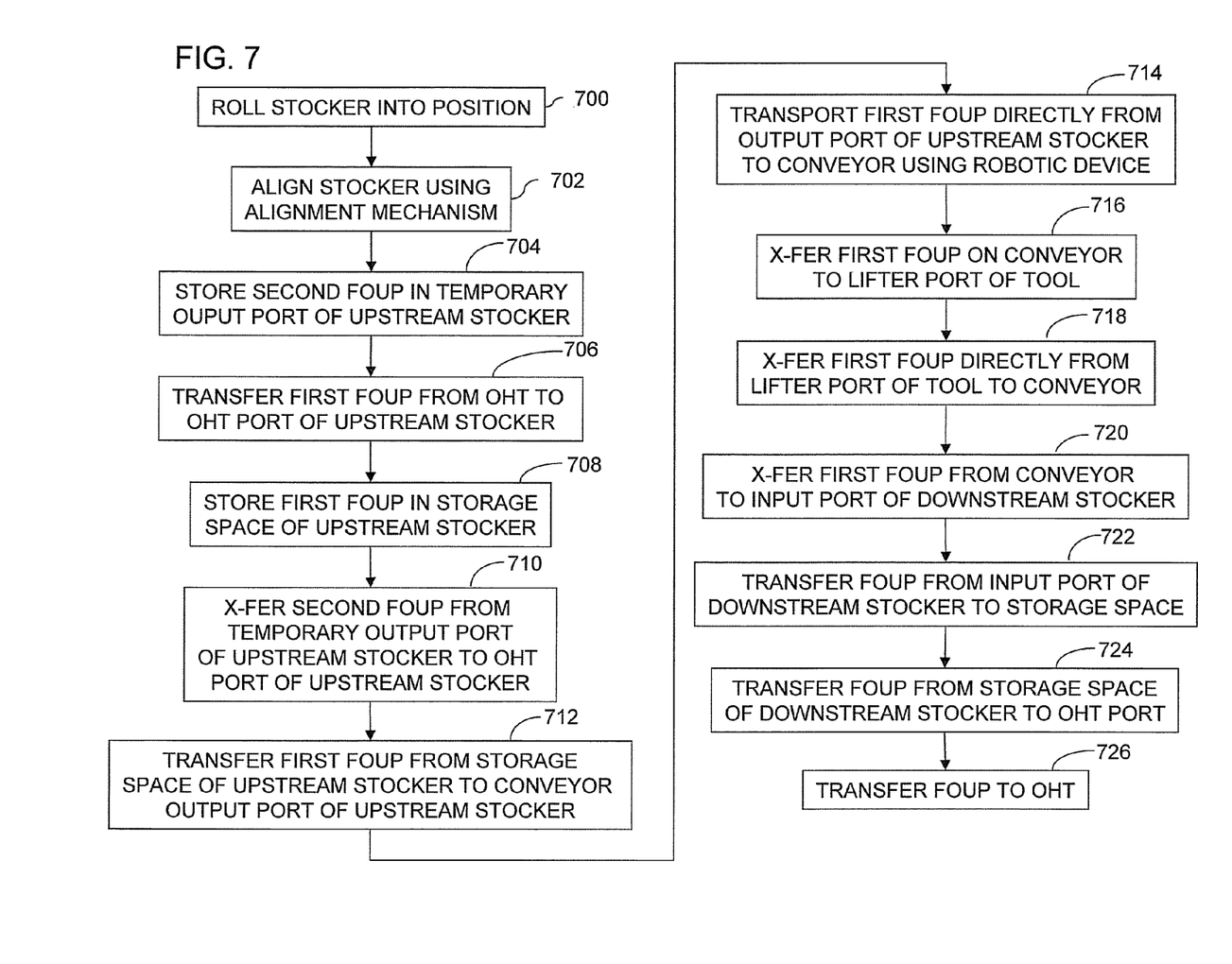
FIG. 7 is a flow chart of a method of operating the system shown in FIGS. 2-6.

FIG. 7 is a flow chart of a method of using the system 200 comprising at least a first stocker having a robotic device, a conveyor, and a semiconductor processing tool having a lifter port, where the first stocker, conveyor and tool are co-located with each other.

At step 700, at least one stocker (e.g., the upstream stocker 202a) is rolled into position on a set of integrally mounted wheels 230.

At step 702, the first stocker 202a is aligned with the conveyor 210 using an alignment mechanism 220 including a component 224 integral to a housing 227 of the first stocker 202a. For example, in the case of the stocker 202a, the stocker is rolled into place so that the male alignment member 224 is received by the female fixed member 222.

At step 704, a second FOUP 204 is stored in a temporary output port 216 of the first stocker 202a, to allow a first FOUP to be transferred from the OHT vehicle 206 to a storage space 211 by way of the OHT port 214. By storing the second FOUP 204 in the temporary output port 216, the second FOUP is in position, ready to be quickly moved to the OHT port 214 for delivery to an OHT vehicle 206, during the same visit in which vehicle 206 delivers the first FOUP 204 to the stocker 202a for storage in a storage space 211, or delivery to the conveyor 210.

At step 706, while the second FOUP 204 waits in the temporary output port 216, the first FOUP 204 is transferred from the vehicle 206 of the OHT 207 to the input port (OHT port 214) of the first stocker 202a.

At step 708, the first FOUP 204 is stored in a storage space 211 of the first (upstream) stocker 202a. To accomplish this, the three-pin mechanism 213 of the robotic device 212 draws the FOUP 204 into the central column 215 of the stocker 202a. Then the robotic device 212 travels vertically along its track 217 to the height of the storage space 211, and the three pin mechanism 213 extends to move the FOUP 204 into the storage space.

At step 710, the robotic device 212 transfers the second FOUP 204 from the temporary output port 216 of the first stocker 202a to the OHT port 214 of the stocker 202a. This includes rotating the head 213 to engage the FOUP 204 in the temporary output port 216, rotating the head to withdraw that FOUP into the center column 215, and rotating the head 213 of robotic device 212 again, to extend the three-pin mechanism 213 to deposit the FOUP 204 in the OHT port 214. The OHT vehicle 206 can now retrieve the second FOUP in the same visit during which the first FOUP is input from the vehicle 206 to the stocker 202a.

At step 712, the first FOUP 204 is transported from the storage space 211 of the first stocker 202a to the conveyor output port 218 of the first stocker 202a. The robotic device 212 withdraws the FOUP 204 from the storage space 211 into the central column 215, and travels vertically along the track 217 to the conveyor (output) port 218.

Then, at step 714, the first FOUP is transported directly from the conveyor output port 218 of the first stocker 202a to the conveyor 210 using the robotic device 212 of the first stocker 202a.

At step 716, the first FOUP is transported on the conveyor directly to the lifter port 209 of the tool 208. The lifter port retrieves the FOUP 204 from the conveyor 210 and moves the FOUP into position for performing a fabrication process step on one of the wafers 250 contained within the FOUP.

At step 718, after completion of the process in tool 208, the FOUP is transported directly from the lifter port 209 of the tool 208 to the conveyor 210.

At step 720, the first FOUP is transferred from the conveyor 210 to the conveyor (input) port 218 of the downstream stocker 202b, using the robotic device 212 of the downstream stocker.

At step 722, the first FOUP 204 is transported from the input port 218 of the downstream stocker 202b to a storage space 211 of the downstream stocker. The downstream stocker 202b stores the first FOUP 204 in the storage space 211 of the downstream stocker.

At step 724, the downstream stocker 202b transports the FOUP 204 from the storage space 211 of the downstream stocker to the OHT (output) port 214 of the downstream stocker 202b, using the robotic device 212 of the downstream stocker.

At step 726, the FOUP is transferred from the OHT port 214 of the downstream stocker 202b to the next available OHT vehicle 206. In the case where one OHT vehicle 206 has delivered the first FOUP to upstream stocker 202a and retrieved the second FOUP from the upstream stocker 202a in the same visit, that same vehicle 206 does not retrieve a FOUP from the downstream stocker 202b during the same visit, and another vehicle 206 may be the next available vehicle to retrieve a FOUP from the downstream stocker 202b.

One of ordinary skill understands that FIG. 7 is just one example of a sequence of operations. The various movements and transfers of FOUPs using the OHT vehicle 206, the robotic device 212 and the conveyor 210 may be performed in a variety of different combinations and sequences.

The stockers 202a and system 200 described above improve the flexibility and configurability of the fab. The mini-stockers 202a can be pre-fabricated by a vendor, and need not be assembled in situ in the fab. Additional mini-stocker units 202a can be quickly relocated, aligned, and integrated into system 200 to provide extra storage capacity. For example, extra stocker units 202a can be relocated to any location where the work in process (WIP) is expected to be high. The extra capacity can allow more FOUPs to be stored near any given tool and avoid any need to store extra FOUPs in remotely located stockers. This in turn can avoid long delays in transporting FOUPs between the tool 208 and a remotely located stocker.

As the needs of the fab change, the stocker 202a can be easily and rapidly moved to another tool or location where extra capacity for storing WIP is desired.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A system comprising:
    a first stocker having external walls containing a storage space;
    a robotic device;
    a conveyor;
    a semiconductor processing tool having a lifter port; and
    an alignment mechanism,
    the first stocker, conveyor and semiconductor processing tool being co-located with each other and the first stocker including a set of integrally mounted wheels and configured to be rolled on the wheels;
    the robotic device configured to transport a Front Opening Unified Pod (FOUP) directly from an output port of the first stocker to the conveyor;
    the conveyor configured to directly transport the FOUP to the lifter port of the semiconductor processing tool, and
    the alignment mechanism including a component integral to a housing of the first stocker and a component fixed to a floor or raised floor and configured to align the first stocker with the conveyor.

2. The system of claim 1, wherein the first stocker has a single vertical column containing a plurality of FOUP storage spaces for storing a plurality of FOUPs, and the robotic device is capable of movement among the plurality of FOUP storage spaces.

3. The system of claim 1, wherein the first stocker comprises an upstream stocker and further comprising a downstream stocker, the upstream stocker configured to receive the FOUP from an overhead transport (OHT) and deliver the FOUP to the conveyor, and the downstream stocker configured to receive the FOUP from the conveyor and deliver the FOUP to the OHT.

4. The system of claim 3, wherein;
    the conveyor is reversible;
    the downstream stocker is further configured to receive the FOUP from the OHT and deliver the FOUP to the conveyor, and
    the upstream stocker is further configured to receive the FOUP from the conveyor and deliver the FOUP to the OHT.

5. The system of claim 1, wherein the first stocker includes a charging port for charging the FOUP with an atmosphere of nitrogen or clean dry air.

6. The system of claim 1, wherein the first stocker has an inverted T-shaped alignment rail coupled to a bottom surface of the first stocker and adapted to align the first stocker with the conveyor, a of the T of the inverted T-shaped alignment rail being oriented upwardly and coupled to the bottom surface.

7. The system of claim 1, wherein the robotic device has a rotating head with a three-kinetic pin mechanism adapted to laterally extend or retract the FOUP upon rotation of the head.

8. The system of claim 1, further comprising an overhead transport (OHT) including a track, disposed above the semiconductor processing tool and the first stocker, and wherein the robotic device is configured to laterally transport the FOUP from the output port to a second port of the first stocker.

9. The system of claim 1, wherein the alignment mechanism includes at least one inverted T-shaped alignment member coupled to and extending downwardly from a bottom surface of the first stocker, and the component fixed to a floor or raised floor includes at least one fixed member having an inverted T-shaped opening extending downwardly from a top surface of the fixed member and adapted to engage the at least one inverted T-shaped alignment member, wherein the at least one inverted T-shaped alignment member is a T-shaped rail with a stem portion of the T of the inverted T-shaped alignment member oriented upwardly and coupled to the bottom surface.

10. The system of claim 9, wherein the at least one inverted T-shaped alignment member is configured to be engaged with the at least one fixed member such that the first stocker is positioned to transport the FOUP between the storage space and the conveyor and between the storage space and an overhead transport.

11. A method comprising:
(a) providing at least a first stocker having external walls containing a storage space; a robotic device; a conveyor; and, a semiconductor processing tool having a lifter port, the first stocker, conveyor and tool being co-located with each other;
(b) transporting a Front Opening Unified Pod (FOUP) directly from an output port of the first stocker to the conveyor using the robotic device of the first stocker; and
(c) transporting the FOUP on the conveyor directly to the lifter port of the tool,
wherein step (a) includes:
rolling the first stocker into position on a set of integrally mounted wheels thereof; and
aligning the first stocker with the conveyor using an alignment mechanism including a component integral to a housing of the first stocker and a component fixed to a floor or raised floor.

12. The method of claim 11, further comprising:
(a1)) transferring the FOUP from an overhead transport (OHT) to an input port of the first stocker;
(a2) storing the FOUP in the storage space of the first stocker; and
(a3) transporting the FOUP from the storage space of the first stocker to the output port of the first stocker, before step (b).

13. The method of claim 12, further comprising:
storing a second FOUP in a temporary output port of the first stocker; and
transferring the second FOUP from the temporary output port of the first stocker to an OHT port of the stocker.

14. The method of claim 11, wherein the at least a first stocker further comprises a downstream stocker having an input port and a robotic device, the method further comprising:
(d) transporting the FOUP directly from the lifter port of the tool to the conveyor;
(e) transporting the FOUP directly from the conveyor to the input port of the downstream stocker using the robotic device of the downstream stocker.

15. The method of claim 14, further comprising:
(a1)) transferring the FOUP from an overhead transport (OHT) to an input port of the first stocker;
(a2) storing the FOUP in the storage space of the first stocker;
(a3) transporting the FOUP from the storage space of the first stocker to the output port of the first stocker, before step (b);
(e1) transporting the FOUP from the input port of the downstream stocker to a storage space of the downstream stocker, after step (e);
(e2) storing the FOUP in the storage space of the downstream stocker; and
(e3) transporting the FOUP from the storage space of the downstream stocker to an output port of the downstream stocker using the robotic device of the downstream stocker.

16. The method of claim 11, further comprising:
rotating a head of the robotic device having a rotating head with a three-kinetic pin mechanism to extend the arm for receiving a first FOUP from an OHT vehicle and for providing a second FOUP to the OHT vehicle, wherein the second FOUP is temporarily stored in a second port on the top of the stocker while the first FOUP is received from the OHT.

* * * * *